United States Patent
Kim et al.

(10) Patent No.: US 11,652,502 B2
(45) Date of Patent: May 16, 2023

(54) BI-DIRECTIONAL SINGLE-ENDED TRANSMISSION SYSTEMS

(71) Applicant: Apple Inc., Cupertino, CA (US)

(72) Inventors: Heegon Kim, Santa Clara, CA (US); Abhilash Rajagopal, San Jose, CA (US); Samir Bouadjel, Los Gatos, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/867,154

(22) Filed: Jul. 18, 2022

(65) Prior Publication Data
US 2022/0352920 A1    Nov. 3, 2022

Related U.S. Application Data

(63) Continuation of application No. 16/983,619, filed on Aug. 3, 2020, now Pat. No. 11,405,068.

(51) Int. Cl.
| H04B 7/00 | (2006.01) |
| H04B 1/40 | (2015.01) |
| H03F 3/45 | (2006.01) |
| H03H 7/01 | (2006.01) |

(52) U.S. Cl.
CPC ........... *H04B 1/40* (2013.01); *H03F 3/45475* (2013.01); *H03H 7/0138* (2013.01); *H03F 2200/451* (2013.01)

(58) Field of Classification Search
CPC ... H04B 1/40; H04B 1/02; H04B 1/04; H04B 1/06; H04B 1/16; H03F 3/45475; H03H 7/0138
See application file for complete search history.

(56) References Cited

U.S. PATENT DOCUMENTS

| 6,396,458 | B1 | 5/2002 | Cockson et al. |
| RE44,202 | E | 5/2013 | Serizawa et al. |
| 9,270,002 | B2* | 2/2016 | Kaper ............... H01P 3/026 |
| 9,984,033 | B2* | 5/2018 | Rohr ............... G06F 13/4282 |
| 10,355,677 | B1 | 7/2019 | Miller et al. |
| 2010/0043045 | A1 | 2/2010 | Shakiba et al. |
| 2010/0218003 | A1 | 8/2010 | Blaha et al. |
| 2011/0002368 | A1 | 1/2011 | Yang |
| 2013/0193947 | A1 | 8/2013 | Poore et al. |

(Continued)

OTHER PUBLICATIONS

Eqcologic NV., "The EqcoLink™ Evaluation Kit Shortform for CoaXPress and other applications", AN0908-SF, Version 0.1, Mar. 26, 2010 (4 pp).

(Continued)

*Primary Examiner* — Tuan Pham
(74) *Attorney, Agent, or Firm* — Young Basile Hanlon & MacFarlane, P.C.

(57) ABSTRACT

Systems for bi-directional single-ended transmission are described. For example, a system may include a receiver with a first differential input terminal and a second differential input terminal, wherein the first differential input terminal is coupled to a first node and the second differential input terminal is coupled to a second node; a transmitter with an output terminal coupled to a third node; a first inductor connected between the first node and the third node; a second inductor connected between the second node and the third node; and a shunt resistor connected between the third node and a ground node.

8 Claims, 6 Drawing Sheets

(56) References Cited

U.S. PATENT DOCUMENTS

| | | |
|---|---|---|
| 2014/0328231 A1 | 11/2014 | Devuyst et al. |
| 2015/0080055 A1 | 3/2015 | Smentek et al. |
| 2019/0096772 A1 | 3/2019 | Moffat et al. |
| 2020/0313720 A1* | 10/2020 | Maarefi .................... H04B 3/04 |
| 2020/0344079 A1 | 10/2020 | Liu |

OTHER PUBLICATIONS

Macom, "Product Detail—M23544", https://www.macom.com/products/product-detail/M23544, Date Unknown, Downloaded Jul. 29, 2020 (4 pp).
Wikipedia, "CoaXPress", https://en.wikipedia.org/wiki/CoaXPress, Date Unknown, Downloaded Jul. 29, 2020 (4 pp).
Coaxpress, "The world's leading interface standard for high-speed imaging", http://www.coaxpress.com, Date Unknown, Downloaded Jul. 29, 2020 (2 pp).
Microchip, "Transceivers for CoaXPress® Camera Solutions", www.microchip.com, Date Unknown, Downloaded Jul. 29, 2020 (2 pp).
Macom, "Product Detail—M22428", https://www.macom.com/products/product-detail/M22428, Date Unknown, Downloaded Jul. 29, 2020 (3 pp).
International Search Report and Written Opinion for PCT/US2021/043923 dated Dec. 2, 2021 (17 pages).

* cited by examiner

BI-DIRECTIONAL SINGLE-ENDED TRANSMISSION SYSTEMS

CROSS-REFERENCE TO RELATED APPLICATION(S)

This application is a continuation of U.S. patent application Ser. No. 16/983,619, which was filed on Aug. 3, 2020. The content of the foregoing application is incorporated herein by reference in its entirety for all purposes.

TECHNICAL FIELD

This disclosure relates to bi-directional single-ended transmission systems.

BACKGROUND

A conventional CoaXPress (CXP) interface may include expensive external off-the-shelf PHYs at front ends of the transceivers. For example, some power-over-coax systems use an application specific integrated circuit (ASIC) with an external cable driver/equalizer to implement a CXP interface. As used herein, CXP refers to the CoaXPress standard for communications over a coaxial cable.

SUMMARY

Disclosed herein are implementations of bi-directional single-ended transmission systems.

In a first aspect, the subject matter described in this specification can be embodied in systems that include a receiver with a first differential input terminal and a second differential input terminal, wherein the first differential input terminal is coupled to a first node and the second differential input terminal is coupled to a second node; a transmitter with an output terminal coupled to a third node; a first inductor connected between the first node and the third node; a second inductor connected between the second node and the third node; and a shunt resistor connected between the third node and a ground node.

In a second aspect, the subject matter described in this specification can be embodied in systems that include a transmitter with a first differential output terminal and a second differential output terminal, wherein the first differential output terminal is coupled to a first node and the second differential output terminal is coupled to a second node; a receiver with an input terminal coupled to a third node; and an inductor and a resistor connected in series between the first node and the third node.

In a third aspect, the subject matter described in this specification can be embodied in systems that include a coaxial cable including an inner conductor and an outer conductor; a first receiver with a first differential input terminal and a second differential input terminal, wherein the first differential input terminal is coupled to a first node, which is coupled to the inner conductor, and the second differential input terminal is coupled to a second node; a first transmitter with a first differential output terminal and a second differential output terminal, wherein the first differential output terminal is coupled to a third node, which is coupled to the inner conductor, and the second differential output terminal is coupled to a fourth node; a second transmitter with an output terminal coupled to a fifth node; a first inductor connected between the first node and the fifth node; a second inductor connected between the second node and the fifth node; a first resistor connected between the fifth node and a ground node; a second receiver with an input terminal coupled to a sixth node; and a third inductor and a second resistor connected in series between the third node and the sixth node.

BRIEF DESCRIPTION OF THE DRAWINGS

Described herein are systems and methods for bi-directional single-ended transmission.

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Described herein are systems and methods for bi-directional single-ended transmission. These systems may provide a bi-directional single-ended power-over-coax link (BSPL). For example, these systems and methods may be used to provide a CoaXPress (CXP) interface. These systems may use software that implements a standard CXP protocol for communications between devices over a coaxial cable. In some implementations, a BSPL compute side interface may be compatible with an off-the-shelf CXP sensor. The hardware implementations of some systems may use relatively less expensive external passive components in low-speed injection circuitry, low-speed extraction circuitry, high-pass filters and amplifiers, rather than expensive off-the-shelf PHY solutions.

Some implementations of the systems and methods describe herein may provide advantages, such as, better low-speed uplink signal integrity with baseline wander correction, better low-speed uplink signal integrity with reduced worst-case coupling noise at the uplink receiver, and/or better high-speed downlink signal integrity, with noise coupling reduction through use of a high-pass filter at a downlink receiver.

Figure 1:
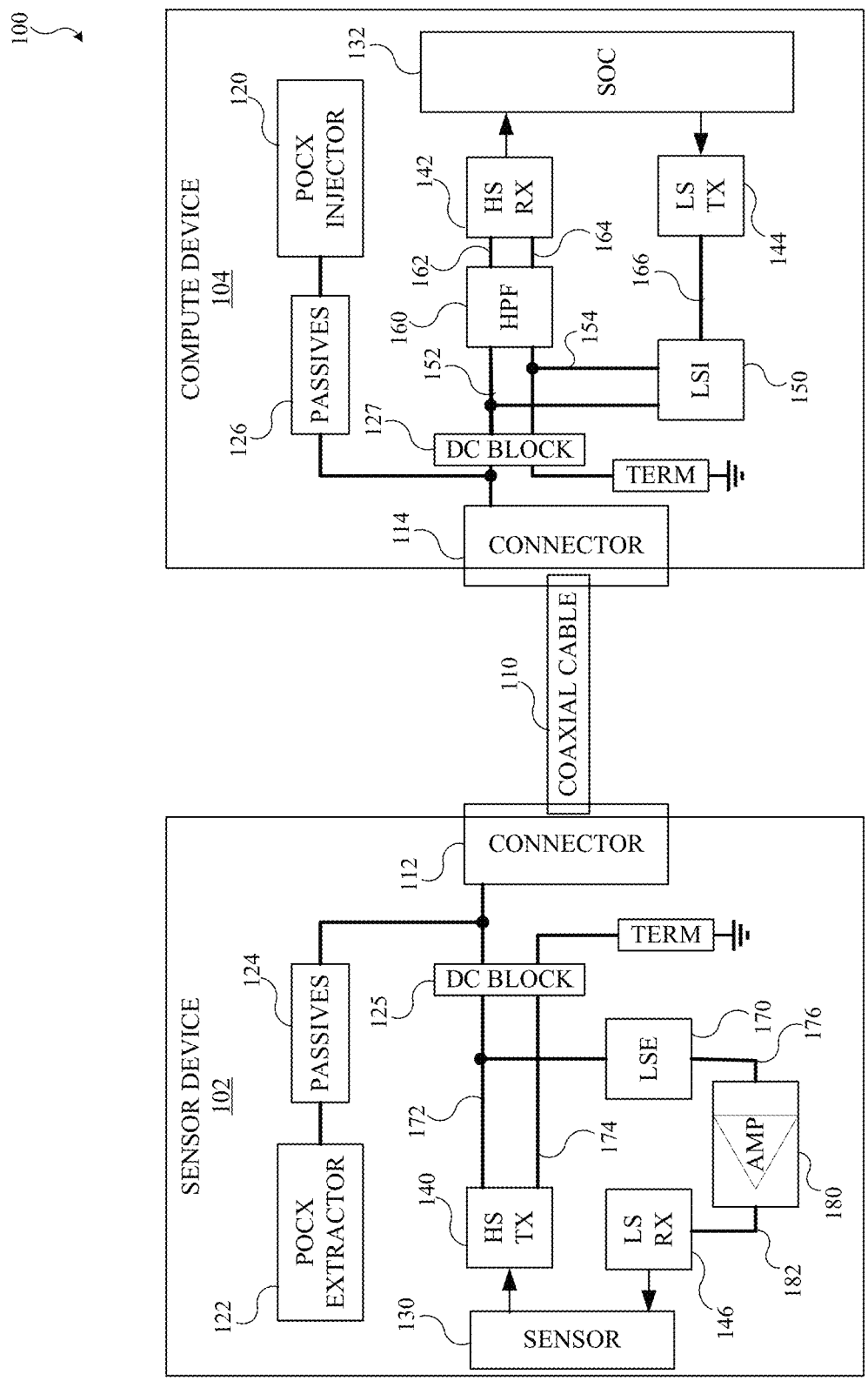
FIG. 1 is a block diagram of an example of a system for bi-directional single-ended transmission.

FIG. 1 is a block diagram of an example of a system 100 for bi-directional single-ended transmission. The system 100 includes a sensor device 102 and a compute device 104 that are connected via a coaxial cable 110. The coaxial cable 110 attaches to a coaxial connector 112 of the sensor device 102 and to a coaxial connector 114 of the compute device 104. The system 100 includes a power-over-coax direct current injector 120, in the compute device 104, and a power-over-coax direct current extractor 122, in the sensor device 102. The power-over-coax direct current extractor 122 and the power-over-coax direct current injector 120 are coupled to a conductor of the coaxial cable 110 via passives 124 and 126. The system 100 includes a sensor 130, in the sensor device 102, and a system-on-a-chip (SOC) 132, in the compute device 104, that is configured to control and process sensor data from the sensor 130. The system 100 includes a high-speed transmitter 140, in the sensor device 102, configured to transmit data via the coaxial cable 110 to a high-speed receiver 142, in the compute device 104. The system 100 includes a low-speed transmitter 144, in the compute device 104, configured to transmit data via the coaxial cable 110 to a low-speed receiver 146, in the sensor device 102. In the compute device 104, the low-speed transmitter 144 is coupled to the communication channel via a low-speed injection circuitry 150, while the high-speed receiver 142 is coupled to the communication channel via a high-pass filter 160. In the sensor device 102, the low-speed receiver 146 is coupled to the communication channel via a low-speed extraction circuitry 170 and an amplifier 180.

The system 100 includes a coaxial cable 110 including an inner conductor and an outer conductor. The coaxial cable 110 is connected between the sensor device 102 and the compute device 104. For example, the coaxial cable 110 may have a characteristic impedance of 50 Ohms. The coaxial cable 110 connects to these devices at their respective coaxial connectors 112 and 114. For example, the coaxial connector 112 and the coaxial connector 114 may be HFM connectors, or any coaxial cable connectors that are impedance matched to the coaxial cable 110. The inner conductor of the coaxial cable 110 may be coupled to a first node 152 in the compute device 104 and to a third node 172 in the sensor device 102.

The system 100 includes a power-over-coax direct current injector 120 coupled to the first node 152. The power-over-coax direct current injector 120 may supply current (e.g., 0.9 Amps or 2 Amps direct current) that may flow through the coaxial cable 110 to the sensor device 102 that is powered by this supplied current. The power-over-coax direct current injector 120 is coupled to the first node 152 via passives 126 and a DC block 127. For example, the passives 126 may be an 8 microhenry inductor.

The system 100 includes a power-over-coax direct current extractor 122 coupled to the third node 172. The power-over-coax direct current extractor 122 may draw current (e.g., 0.9 Amps, 1.5 Amps, or 2 Amps direct current) that may flow through the coaxial cable 110 from the compute device 104 that supplies power to the sensor device 102. The power-over-coax direct current extractor 122 is coupled to the third node 172 via passives 124 and a DC block 125. For example, the passives 124 may be an 8 microhenry inductor.

The system 100 includes a high-speed transmitter 140 with a first differential output terminal and a second differential output terminal. The first differential output terminal is coupled to the third node 172 and the second differential output terminal is coupled to a fourth node 174. For example, the high-speed transmitter 140 may be configured to transmit differential signals, such as Low-Voltage Differential Signaling (LVDS), across the first differential output terminal and a second differential output terminal. In some implementations, the high-speed transmitter 140 is configured to transmit differential signals with a voltage swing level of approximately 1 Volt. In some implementations, the high-speed transmitter 140 is configured to transmit CoaXPress high-speed downlink signals, which may support data rates of up to 10 gigabits per second or 12.5 gigabits per second. For example, the high-speed transmitter 140 may read data (e.g., image data or other sensor data) for transmission from the sensor 130 (e.g., an image sensor, a radar sensor, a lidar sensor, or another type of sensor) via a native interface (e.g., an LVDS/Mobile Industry Processor Interface (MIPI)/display port (DP) interface).

The system 100 includes a high-speed receiver 142 with a first differential input terminal 162 and a second differential input terminal 164. The first differential input terminal 162 is coupled to the first node 152 and the second differential input terminal 164 is coupled to a second node 154. For example, the high-speed receiver 142 may be configured to receive differential signals, such as Low-Voltage Differential Signaling (LVDS), appearing between the first differential input terminal 162 and the second differential input terminal 164. In some implementations, the high-speed receiver 142 is configured to receive differential signals with a voltage swing level of approximately 1 Volt. In some implementations, the high-speed receiver 142 is configured to receive CoaXPress high-speed downlink signals, which may support data rates of up to 10 gigabits per second or 12.5 gigabits per second. For example, the high-speed receiver 142 may in turn pass received data (e.g., image data or other sensor data) to the system-on-a-chip 132 via a serial bus interface (e.g., a Peripheral Component Interconnect Express (PCIe) Gen 4 bus).

The system 100 includes a low-speed transmitter 144 with an output terminal 166 coupled to a fifth node. For example, the low-speed transmitter 144 may generate signals at the output terminal 166 using Low-Voltage Complementary Metal Oxide Semiconductor (LVCMOS). For example, the high-speed receiver 142 may be configured to operate at a higher carrier frequency than the low-speed transmitter 144. In some implementations, the low-speed transmitter 144 is configured to transmit CoaXPress low-speed uplink signals, which may support data rates of 42 megabits per second. For example, the uplink can be used for sensor (e.g., camera) control, triggering and firmware updates for the sensor device 102 connected via the coaxial cable 110. For example, the low-speed transmitter 144 may read data (e.g., control data, firmware, or triggering data) for transmission from the system-on-a-chip 132 via a serial bus interface (e.g., a Peripheral Component Interconnect Express (PCIe) Gen 4 bus). In some implementations, the low-speed transmitter 144 and the high-speed receiver 142 are implemented in a single application specific integrated circuit (ASIC) in the compute device 104.

The system 100 includes a low-speed receiver 146 with an input terminal 182 coupled to a sixth node 176. The system includes an amplifier 180 coupling the sixth node 176 to the input terminal 182. For example, the low-speed receiver 146 may receive signals at the input terminal 182 using Stub Series Terminated Logic (SSTL). In some implementations, the low-speed receiver 146 is configured to receive CoaXPress low-speed uplink signals, which may support data rates of 42 megabits per second. For example, the uplink can be used for sensor (e.g., camera) control, triggering and firmware updates for the sensor device 102. For example, the low-speed receiver 146 may in turn pass received data (e.g., control data, firmware, or triggering data) to the sensor 130 via a native interface (e.g., an LVDS/Mobile Industry Processor Interface MIPI)/display port (DP) interface). In some implementations, the low-speed receiver 146 and the high-speed transmitter 140 are implemented in a single application specific integrated circuit (ASIC) in the sensor device 102.

For example, the high-speed transmitter 140 and the high-speed receiver 142 may be configured to operate at a higher carrier frequency than the low-speed transmitter 144 and the low-speed receiver 146. In some implementations, the high-speed transmitter 140 and the high-speed receiver 142 are configured to transfer CoaXPress high-speed downlink signals and the low-speed transmitter 144 and the low-speed receiver 146 are configured to transmit CoaXPress low-speed uplink signals The system 100 includes a low-speed injection circuitry 150 that couples the output terminal 166 of the low-speed transmitter 144 to the first node 152 and the second node 154 to enable the transmission of low-speed signals over the coaxial cable 110 concurrent with reception of high-speed signals by the high-speed receiver 142 and supply of power by the power-over-coax direct current injector 120. In some implementations, the electrical parameters of the low-speed injection circuitry 150 may be chosen to correct or mitigate baseline wander caused primarily by the power-over-coax direct current injector 120 and/or its passives 126. For example, the low-speed injection circuitry 150 may be the low-speed injection circuitry 240 of FIG. 2. The electrical parameters of the low-speed injection circuitry 150 may result in a sufficiently long RL time constant (e.g., 1200 nanoseconds) to mitigate signal integrity degradation of the low-speed signals by baseline wander.

The system 100 includes a high-pass filter 160 coupling the first differential input terminal 162 to the first node 152 and coupling the second differential input terminal 164 to the second node 154. Asymmetry between the differential pair may generate low-speed noise at the high-speed receiver 142, which may propagate from the low-speed transmitter 144 to the high-speed receiver 142. For example, asymmetry may be caused by "Cable vs 50 ohm" impedance mismatch, the passives 126, and/or component tolerances in the circuitry of the compute device 104. The high-pass filter 160 may filter out this low-speed noise coupling, resulting in better high-speed signal integrity. For example, the high-pass filter 160 may be the high-pass filter 230 of FIG. 2.

The system 100 includes a low-speed extraction circuitry 170 that couples signals from the third node 172 to the sixth node 176. In some implementations, the fourth node 174 is isolated from the sixth node 176. The low-speed extraction circuitry 170 may have an unbalanced structure, which may provide better low-speed signal integrity than balanced topologies. For example, the low-speed extraction circuitry 170 may be the low-speed extraction circuitry 340 of FIG. 3.

Figure 2:
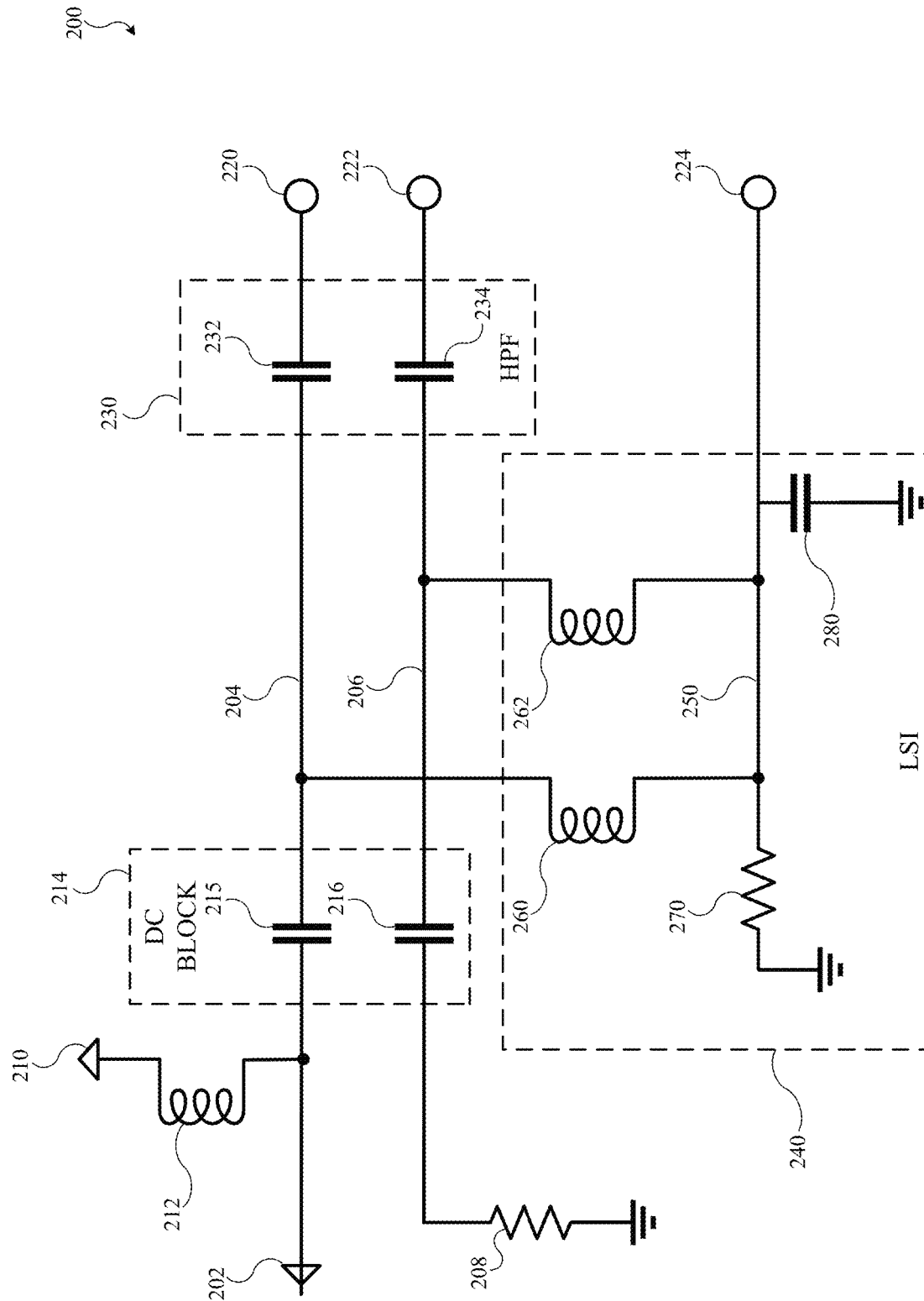
FIG. 2 is a circuit diagram of an example of a system including low-speed injection circuitry.

FIG. 2 is a circuit diagram of an example of a system 200 including low-speed injection circuitry 240. The system 200 includes a cable connector with a first conductor 202 coupled to a first node 204 and a second node 206 coupled via a termination resistor 208 to a ground node. The system 200 includes a power-over-coax direct current injector 210 coupled to the first node 204; a first differential input terminal 220 and a second differential input terminal 222 for a receiver; an output terminal 224 for a transmitter; a first capacitor 232 connected between the first differential input terminal 220 and the first node 204; a second capacitor 234 connected between the second differential input terminal 222 and the second node 206; and the low-speed injection circuitry 240 that couples the output terminal 224 to the first node 204 and the second node 206. The low-speed injection circuitry 240 includes a third node 250 coupled to the output terminal 224; a first inductor 260 connected between the first node 204 and the third node 250; a second inductor 262 connected between the second node 206 and the third node 250; a shunt resistor 270 connected between the third node 250 and a ground node; and an output capacitor 280 connected between the third node 250 and a ground node. For example, the low-speed injection circuitry 240 may be used inject low-speed signals from the transmitter onto the first conductor 202 of the cable connector, while high-speed signals are received by the receiver.

The system 200 includes a receiver (e.g., the high-speed receiver 142) with a first differential input terminal 220 and a second differential input terminal 222. The first differential input terminal 220 is coupled to a first node 204 and the second differential input terminal 222 is coupled to a second node 206. For example, the receiver may be configured to receive differential signals, such as Low-Voltage Differential Signaling (LVDS), appearing between the first differential input terminal 220 and the second differential input terminal 222. In some implementations, the receiver is configured to receiver differential signals with a voltage swing level of approximately 1 Volt. In some implementations, the receiver is configured to receive CoaXPress high-speed downlink signals, which may support data rates of up to 10 gigabits per second or 12.5 gigabits per second.

The system 200 may include a high-pass filter 230 coupling the first differential input terminal 220 to the first node 204 and coupling the second differential input terminal 222 to the second node 206. In this example, the high-pass filter 230 includes a first capacitor 232 connected between the first differential input terminal 220 and the first node 204; and a second capacitor 234 connected between the second differential input terminal 222 and the second node 206. For example, the first capacitor 232 may be a 33 picofarad capacitor. For example, the second capacitor 234 may be a 33 picofarad capacitor.

The system 200 includes a coaxial cable connector with a first conductor 202 coupled to the first node 204. In this example, the first conductor 202 is coupled to the first node 204 via a first DC block capacitor 215. For example, when connected to a coaxial cable, the first conductor 202 may be connected to an inner conductor of the coaxial cable. The coaxial cable connector also includes a termination resistor 208 (e.g., 50 Ohms) that is connected to a ground node. For example, the coaxial cable connector may be an HFM connector, or any coaxial cable connector that is impedance matched to the coaxial cable to be used.

The system 200 includes a DC block 214. The DC block 214 may serve to isolate the high-speed receiver, low-speed transmitter, and LSI circuits from the high DC current (e.g., 2 Amps) from the power-over-coax direct current injector 210. The DC block 214 includes a first DC block capacitor 215 (e.g., a 100 nanofarad capacitor), which is connected between the first conductor 202 of the coaxial cable connector and the first node 204, and a second DC block capacitor 216 (e.g., a 100 nanofarad capacitor), which is connected between the termination resistor 208 and the second node 206. These two capacitors of the DC block 214 may balance between node 204 and node 206.

The system 200 includes a power-over-coax direct current injector 210 coupled to the first node 204. The power-over-coax direct current injector 210 may supply current (e.g., 2A direct current) that may flow through a coaxial cable connected to the coaxial cable connector to a sensor device (e.g., the sensor device 102) that is powered by this supplied current. The power-over-coax direct current injector 210 is coupled to the first node 204 via a power inductor 212 and the DC block capacitor 215. For example, the power inductor 212 may be an 8 microhenry inductor.

The system 200 includes a transmitter with an output terminal 224 coupled to a third node 250. In this example, the output terminal 224 is connected to the third node 250. For example, the receiver may be configured to operate at a higher carrier frequency than the transmitter. In some implementations, the transmitter is configured to transmit CoaX- Press low-speed uplink signals, which may support data rates of 42 megabits per second. For example, the uplink can be used for sensor (e.g., camera) control, triggering and firmware updates for a sensor device connected via a coaxial cable.

Figure 5:
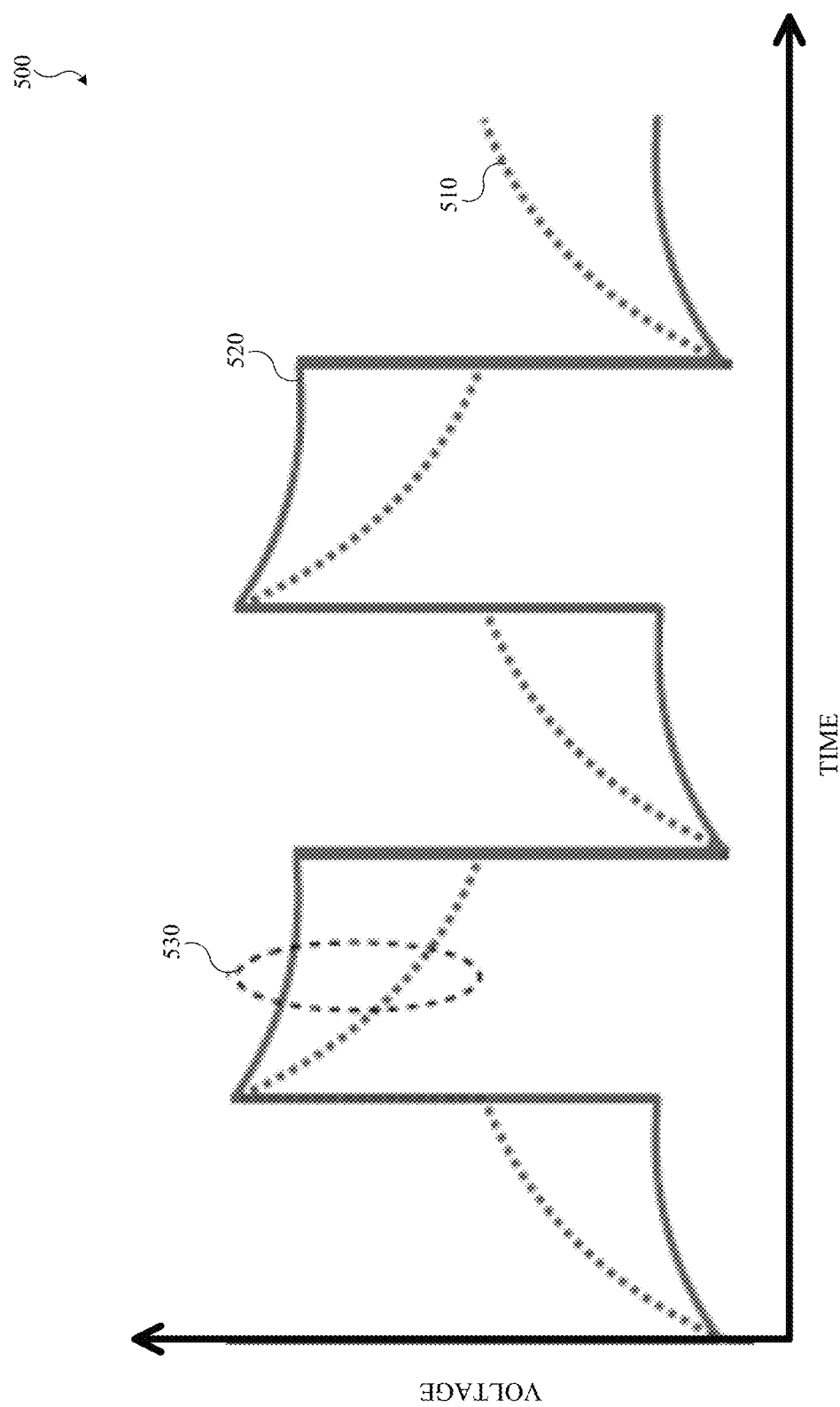
FIG. 5 is a graph of examples of low-speed voltage signals with different levels of baseline wander distortion.

The output terminal 224 of the transmitter is coupled to the first node 204 and the second node 206 via a low-speed injection circuitry 240 to enable the transmission of low-speed signals over a coaxial cable attached to the coaxial cable connector concurrent with reception of high-speed signals by the receiver and supply of power by the power-over-coax direct current injector 210. The low-speed injection circuitry 240 includes a first inductor 260 connected between the first node 204 and the third node 250; a second inductor 262 connected between the second node 206 and the third node 250; a shunt resistor 270 connected between the third node 250 and a ground node; and an output capacitor 280 connected between the third node 250 and a ground node. The electrical parameters of the low-speed injection circuitry 240 may be chosen to correct or mitigate baseline wander caused primarily by the power inductor 212. For example, the first inductor 260 and the second inductor 262 may be 700 nanohenry inductors. For example, the shunt resistor 270 may be a 4 Ohm resistor. For example, the output capacitor 280 may be a 100 picofarad capacitor. The electrical parameters of the low-speed injection circuitry 240 may result in a sufficiently long RL time constant (e.g., 1200 nanoseconds) to mitigate signal integrity degradation of the low-speed signals by baseline wander. For example, baseline wander may be mitigated as illustrated in FIG. 5. The baseline wander correction may improve low-speed uplink eye margin.

Figure 3:
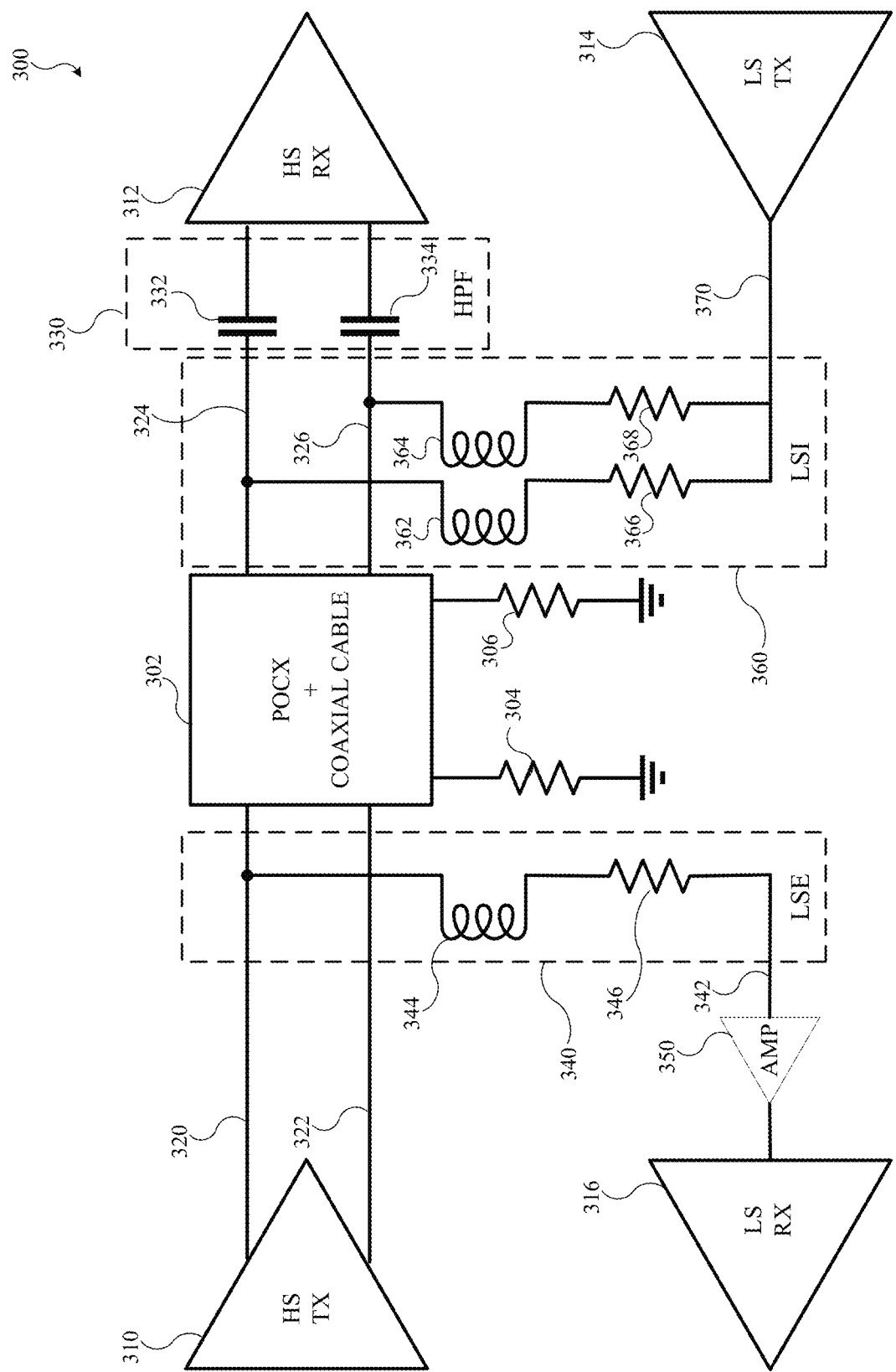
FIG. 3 is a circuit diagram of an example of a system including low-speed extraction circuitry.

FIG. 3 is a circuit diagram of an example of a system 300 including low-speed extraction circuitry. The system 300 includes a power-over-coax system 302 including a coaxial cable and termination resistors 304 and 306 at the ends of the coaxial cable. The system 300 includes a high-speed transmitter 310; a high-speed receiver 312; a low-speed transmitter 314; and a low-speed receiver 316 that are collectively configured to transfer data in both directions via the coaxial cable. The system 300 includes a high-pass filter 330 coupling differential input terminals of the high-speed receiver 312 to the power-over-coax system 302; a low-speed extraction circuitry 340 and an amplifier 350 connected in series between the power-over-coax system 302 and the low-speed receiver 316; and a low-speed injection circuitry 360 coupling the low-speed transmitter 314 to the power-over-coax system 302.

The system 300 includes a power-over-coax system 302 including a coaxial cable with a termination resistor 304 and a termination resistor 306 at the ends of the coaxial cable coupling to ground terminals. The termination resistor 304 and the termination resistor 306 may be impedance matched to the coaxial cable of the power-over-coax system 302. For example, the power-over-coax system 302 may include the coaxial cable 110, the coaxial connector 112, the coaxial connector 114, the power-over-coax injector 120, and the power-over-coax direct current extractor 122.

The system 300 includes a high-speed transmitter 310 with a first differential output terminal and a second differential output terminal. The first differential output terminal is coupled to a first node 320 and the second differential output terminal is coupled to a second node 322. The high-speed transmitter 310 may be configured to transmit signals through the power-over-coax system 302. For example, the power-over-coax system 302 may include a coaxial cable connector (e.g., the coaxial cable connector 112) with a first conductor coupled to the first node 320. In some implementations, the power-over-coax system 302 may include a power-over-coax direct current extractor (e.g., the power-over-coax direct current extractor 122) coupled to the first node 320. For example, the high-speed transmitter 310 may be configured to transmit differential signals, such as Low-Voltage Differential Signaling (LVDS), across the first differential output terminal and a second differential output terminal. In some implementations, the high-speed transmitter 310 is configured to transmit differential signals with a voltage swing level of approximately 1 Volt. In some implementations, the high-speed transmitter 310 is configured to transmit CoaXPress high-speed downlink signals, which may support data rates of up to 10 gigabits per second or 12.5 gigabits per second. For example, the high-speed transmitter 310 may be the high-speed transmitter 140 of FIG. 1.

The system 300 includes a low-speed receiver 316 with an input terminal coupled to a third node 342. For example, the high-speed transmitter 310 may be configured to operate at a higher carrier frequency than the low-speed receiver 316. The system includes an amplifier 350 coupling the third node 342 to the input terminal of the low-speed receiver 316. For example, the amplifier 350 may include an operational amplifier. For example, the low-speed receiver 316 may receive signals at the input terminal using Stub Series Terminated Logic (SSTL). In some implementations, the low-speed receiver 316 is configured to receive CoaXPress low-speed uplink signals, which may support data rates of 42 megabits per second. For example, the low-speed receiver 316 may be the low-speed receiver 146 of FIG. 1.

The system 300 includes an inductor 344 and a resistor 346 connected in series between the first node 320 and the third node 342. The inductor 344 and the resistor 346 are components of a low-speed extraction circuitry 340 that is configured to couple signals from the first node 320 of the differential pair (320 and 322) to the low-speed receiver 316. For example, the second node 322 may be isolated from the third node 342. The low-speed extraction circuitry 340 may provide advantages over conventional power-over-coax terminal topologies. For example, the low-speed extraction circuitry 340 with an unbalanced structure may have better low-speed signal integrity comparing to alternative topologies with balanced connections to both nodes of the differential pair (320 and 322) used by the high-speed transmitter 310. Balanced topologies may suffer from significant noise coupling from a high-speed transmitter to a low-speed amplifier input caused by component tolerances. The unbalanced structure of the low-speed extraction circuitry 340 may provide more immunity to high-speed noise coupling (e.g., worst-case noise coupling may be decreased from 100 mV to 25 mV). The inclusion of the inductor 344 may provide low-pass filtering to further reduce noise coupling from the high-speed transmitter 310. For example, the inductor 344 may be a 900 nanohenry inductor. For example, the resistor 346 may be a 280 Ohm resistor.

The system 300 includes a high-speed receiver 312 with a first differential input terminal and a second differential input terminal. The first differential input terminal is coupled to a fourth node 324 and the second differential input terminal is coupled to a fifth node 326. The high-speed receiver 312 may be configured to receive signals transmitted through the power-over-coax system 302 by the high-speed transmitter 310. For example, the high-speed receiver 312 may be configured to receive differential signals, such as Low-Voltage Differential Signaling (LVDS), appearing between the first differential input terminal and the second differential input terminal. In some implementations, the high-speed receiver 312 is configured to receive differential signals with a voltage swing level of approximately 1 Volt. In some implementations, the high-speed receiver 312 is configured to receive CoaXPress high-speed downlink signals, which may support data rates of up to 10 gigabits per second or 12.5 gigabits per second.

The system 300 includes a high-pass filter 330 coupling the first differential input terminal to the fourth node 324 and coupling the second differential input terminal to the fifth node 326. In this example, the high-pass filter 330 includes a first capacitor 332 connected between the first differential input terminal and the fourth node 324; and a second capacitor 334 connected between the second differential input terminal and the fifth node 326.

The system 300 includes a low-speed transmitter 314 with an output terminal coupled to a sixth node 370. For example, the low-speed transmitter 314 may generate signals at the output terminal using Low-Voltage Complementary Metal Oxide Semiconductor (LVCMOS). For example, the high-speed receiver 312 may be configured to operate at a higher carrier frequency than the low-speed transmitter 314. In some implementations, the low-speed transmitter 314 is configured to transmit CoaXPress low-speed uplink signals, which may support data rates of 42 megabits per second. For example, the uplink can be used for sensor (e.g., camera) control, triggering and firmware updates for a sensor device (e.g., the sensor device 102) connected via the power-over-coax system 302.

The output terminal of the low-speed transmitter 314 is coupled to the fourth node 324 and the fifth node 326 via a low-speed injection circuitry 360 to enable the transmission of low-speed signals through the power-over-coax system 302 concurrent with reception of high-speed signals by the high-speed receiver 312 and supply of power by the power-over-coax system 302. The low-speed injection circuitry 360 includes a second inductor 362 connected in series with a second resistor 366 between the fourth node 324 and the sixth node 370; and a third inductor 364 connected in series with a third resistor 368 between the fifth node 326 and the sixth node 370. The low-speed injection circuitry 360 may use a balanced structure with respect to the differential pair (324 and 326). For example, the second inductor 362 and the third inductor 364 may be 590 nanohenry inductors. For example, the second resistor 366 and the third resistor 368 may be 348 Ohm resistors. The electrical parameters of the low-speed injection circuitry 360 may result in a relatively short RL time constant (e.g., 120 nanoseconds), which may make the low-speed injection circuitry 360 more susceptible to baseline wander than the low-speed injection circuitry 240 of FIG. 2.

Asymmetry between the differential pair (324 and 326) may generate low-speed noise at high-speed receiver 312, which may propagate from the low-speed transmitter 314 to the high-speed receiver 312. For example, asymmetry may be caused by an impedance mismatch in the power-over-coax system 302 and/or component tolerances in the circuitry of the low-speed injection circuitry 360. The high-pass filter 330 may filter out this low-speed noise coupling, resulting in better high-speed signal integrity.

Figure 4:
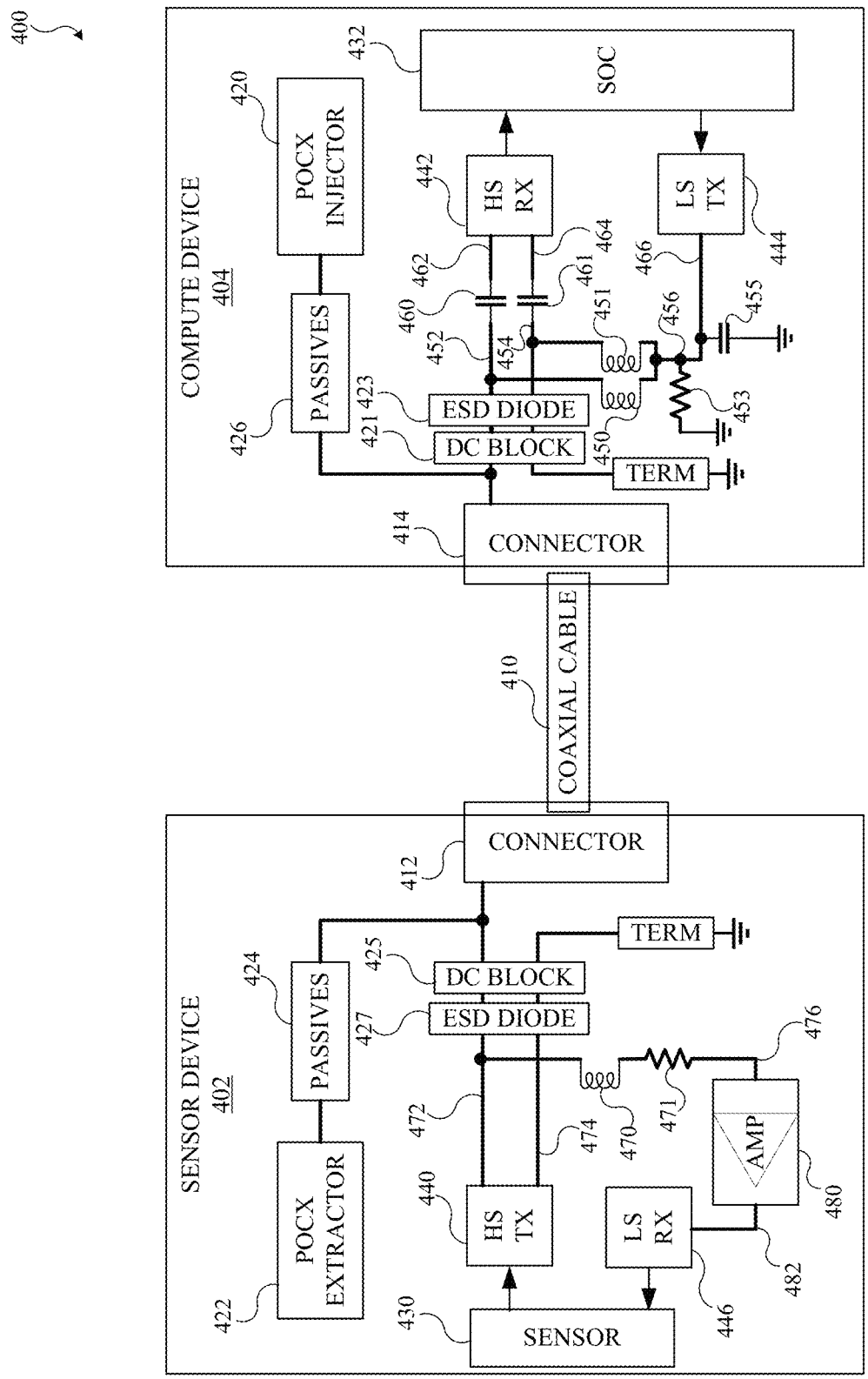
FIG. 4 is a circuit diagram of an example of a system for bi-directional single-ended transmission.

FIG. 4 is a circuit diagram of an example of a system 400 for bi-directional single-ended transmission. The system 400 includes a sensor device 402 and a compute device 404 that are connected via a coaxial cable 410. The coaxial cable 410 attaches to a coaxial connector 412 of the sensor device 402 and to a coaxial connector 414 of the compute device 404. The system 400 includes a power-over-coax direct current injector 420, in the compute device 404, and a power-over-coax direct current extractor 422, in the sensor device 402. The power-over-coax direct current extractor 422 and the power-over-coax direct current injector 420 are coupled to a conductor of the coaxial cable 410 via passives 424 and 426. The system 400 includes a sensor 430, in the sensor device 402, and a system-on-a-chip (SOC) 432, in the compute device 404, that is configured to control and process sensor data from the sensor 430. The system 400 includes a high-speed transmitter 440, in the sensor device 402, configured to transmit data via the coaxial cable 410 to a high-speed receiver 442, in the compute device 404. The system 400 includes a low-speed transmitter 444, in the compute device 404, configured to transmit data via the coaxial cable 410 to a low-speed receiver 446, in the sensor device 402. In the compute device 404, the low-speed transmitter 444 is coupled to the communication channel via a low-speed injection circuitry, including a first inductor 450; a second inductor 451; and a first resistor 453, while the high-speed receiver 442 is coupled to the communication channel via a high-pass filter, including a first capacitor 460 and a second capacitor 461. In the sensor device 402, the low-speed receiver 446 is coupled to the communication channel via a low-speed extraction circuitry, including a third inductor 470 and a second resistor 471, and an amplifier 480. The system 400 may provide advantages over conventional power-over-coax terminal topologies. For example, the system 400 may provide better low-speed uplink signal integrity due to baseline wander correction implemented with the low-speed injection circuitry. For example, the system 400 may provide better high-speed downlink signal integrity due to noise coupling reduction implemented with the high-pass filter.

The system 400 includes a coaxial cable 410 including an inner conductor and an outer conductor. The coaxial cable 410 is connected between the sensor device 402 and the compute device 404. For example, the coaxial cable 410 may have a characteristic impedance of 50 Ohms. The coaxial cable 410 connects to these devices at their respective coaxial connectors 412 and 414. For example, the coaxial connectors 412 and the coaxial connectors 414 may be HFM connectors, or any coaxial cable connectors that are impedance matched to the coaxial cable 410. The inner conductor of the coaxial cable 410 may be coupled to a first node 452 in the compute device 404 and to a third node 472 in the sensor device 402.

The system 400 includes a power-over-coax direct current injector 420 coupled to the first node 452. The power-over-coax direct current injector 420 may supply current (e.g., 0.9 Amps or 2 Amps direct current) that may flow through the coaxial cable 410 to the sensor device 402 that is powered by this supplied current. The power-over-coax direct current injector 420 is coupled to the first node 452 via passives 426, a DC block 421, and an ESD diode 423. For example, the passives 426 may be an 8 microhenry inductor.

The system 400 includes a power-over-coax direct current extractor 422 coupled to the third node 472. The power-over-coax direct current extractor 422 may draw current (e.g., 0.9 Amps or 2 Amps direct current) that may flow through the coaxial cable 410 from the compute device 404 that supplies power to the sensor device 402. The power-over-coax direct current extractor 422 is coupled to the third node 472 via passives 424, a DC block 425, and an ESD diode 427. For example, the passives 424 may be an 8 microhenry inductor.

The system 400 includes a high-speed transmitter 440 with a first differential output terminal and a second differential output terminal. The first differential output terminal is coupled to the third node 472 and the second differential output terminal is coupled to a fourth node 474. For example, the high-speed transmitter 440 may be configured to transmit differential signals, such as Low-Voltage Differential Signaling (LVDS), across the first differential output terminal and a second differential output terminal. In some implementations, the high-speed transmitter 440 is configured to transmit differential signals with a voltage swing level of approximately 1 Volt. In some implementations, the high-speed transmitter 440 is configured to transmit CoaXPress high-speed downlink signals, which may support data rates of up to 10 gigabits per second or 12.5 gigabits per second. For example, the high-speed transmitter 440 may read data (e.g., image data or other sensor data) for transmission from the sensor 430 (e.g., an image sensor or another type of sensor) via a native interface (e.g., an LVDS/Mobile Industry Processor Interface MIPI)/display port (DP) interface).

The system 400 includes a high-speed receiver 442 with a first differential input terminal 462 and a second differential input terminal 464. The first differential input terminal 462 is coupled to the first node 452 and the second differential input terminal 464 is coupled to a second node 454. For example, the high-speed receiver 442 may be configured to receive differential signals, such as Low-Voltage Differential Signaling (LVDS), appearing between the first differential input terminal 462 and the second differential input terminal 464. In some implementations, the high-speed receiver 442 is configured to receive differential signals with a voltage swing level of approximately 1 Volt. In some implementations, the high-speed receiver 442 is configured to receive CoaXPress high-speed downlink signals, which may support data rates of up to 10 gigabits per second or 12.5 gigabits per second. For example, the high-speed receiver 442 may in turn pass received data (e.g., image data or other sensor data) to the system-on-a-chip 432 via a serial bus interface (e.g., a Peripheral Component Interconnect Express (PCIe) Gen 4 bus).

The system 400 includes a low-speed transmitter 444 with an output terminal 466 coupled to a fifth node 456. For example, the low-speed transmitter 444 may generate signals at the output terminal 466 using Low-Voltage Complementary Metal Oxide Semiconductor (LVCMOS). For example, the high-speed receiver 442 may be configured to operate at a higher carrier frequency than the low-speed transmitter 444. In some implementations, the low-speed transmitter 444 is configured to transmit CoaXPress low-speed uplink signals, which may support data rates of 42 megabits per second. For example, the uplink can be used for sensor (e.g., camera) control, triggering and firmware updates for the sensor device 402 connected via the coaxial cable 410. For example, the low-speed transmitter 444 may read data (e.g., control data, firmware, or triggering data) for transmission from the system-on-a-chip 432 via a serial bus interface (e.g., a Peripheral Component Interconnect Express (PCIe) Gen 4 bus).

The system 400 includes a low-speed receiver 446 with an input terminal 482 coupled to a sixth node 476. The system includes an amplifier 480 (e.g., including an operational amplifier) coupling the sixth node 476 to the input terminal 482. For example, the low-speed receiver 446 may receive signals at the input terminal 482 using Stub Series Terminated Logic (SSTL). In some implementations, the low-speed receiver 446 is configured to receive CoaXPress low-speed uplink signals, which may support data rates of 42 megabits per second. For example, the uplink can be used for sensor (e.g., camera) control, triggering and firmware updates for the sensor device 402. For example, the low-speed receiver 446 may in turn pass received data (e.g., control data, firmware, or triggering data) to the sensor 430 via a native interface (e.g., an LVDS/Mobile Industry Processor Interface (MIPI)/display port (DP) interface).

For example, the high-speed transmitter 440 and the high-speed receiver 442 may be configured to operate at a higher carrier frequency than the low-speed transmitter 444 and the low-speed receiver 446. In some implementations, the high-speed transmitter 440 and the high-speed receiver 442 are configured to transfer CoaXPress high-speed downlink signals and the low-speed transmitter 444 and the low-speed receiver 446 are configured to transmit CoaXPress low-speed uplink signals.

The system 400 includes a low-speed injection circuitry that couples the output terminal 466 of the low-speed transmitter 444 to the first node 452 and the second node 454 to enable the transmission of low-speed signals over the coaxial cable 410 concurrent with reception of high-speed signals by the high-speed receiver 442 and supply of power by the power-over-coax direct current injector 420. The low-speed injection circuitry includes a first inductor 450 connected between the first node 452 and the fifth node 456, a second inductor 451 connected between the second node 454 and the fifth node 456, and a first resistor 453 connected between the fifth node 456 and a ground node. The low-speed injection circuitry also includes a third capacitor 455 connected between the fifth node 456 and a ground node. In some implementations, the electrical parameters of the low-speed injection circuitry may be chosen to correct or mitigate baseline wander caused primarily by the power-over-coax direct current injector 420 and/or its passives 426. For example, the first inductor 450 and the second inductor 451 may be 700 nanohenry inductors. For example, the first resistor 453 may be a 4 Ohm resistor. For example, the third capacitor 455 may be a 100 picofarad capacitor. The electrical parameters of the low-speed injection circuitry may result in a sufficiently long RL time constant (e.g., 1200 nanoseconds) to mitigate signal integrity degradation of the low-speed signals by baseline wander.

The system 400 includes a high-pass filter coupling the first differential input terminal 462 to the first node 452 and coupling the second differential input terminal 464 to the second node 454. The high-pass filter includes a first capacitor 460 connected between the first differential input terminal 462 and the first node 452; and a second capacitor 461 connected between the second differential input terminal 464 and the second node 454. For example, the first capacitor 460 and the second capacitor 461 may be 33 picofarad capacitors. Asymmetry between the differential pair may generate low-speed noise at high-speed receiver 442, which may propagate from the low-speed transmitter 444 to the high-speed receiver 442. For example, asymmetry may be caused by "Cable vs 50 ohm" impedance mismatch, the passives 426, and/or component tolerances in the circuitry of the compute device 404. The high-pass filter may filter out this low-speed noise coupling, resulting in better high-speed signal integrity.

The system 400 includes a low-speed extraction circuitry that couples signals from the third node 472 to the sixth node 476. The low-speed extraction circuitry includes a third inductor 470 and a second resistor 471 connected in series between the third node 472 and the sixth node 476. For example, the third inductor 470 may be a 900 nanohenry inductor. For example, the second resistor 471 may be a 280 Ohm resistor. The low-speed extraction circuitry may have an unbalanced structure, which may provide better low-speed signal integrity than balanced topologies. In some implementations, the fourth node 474 is isolated from the sixth node 476.

FIG. 5 is a graph 500 of examples of low-speed voltage signals with different levels of baseline wander distortion. The y-axis of the graph 500 represents voltage and the x-axis represents time. The graph 500 overlays plots of two examples of low-speed voltage signals from different power-over-coax systems. A first low-speed voltage signal 510 is from a power-over-coax system subject to significant baseline wander distortion, which causes the voltage levels to exponentially decay toward a mean value between state transitions of the first low-speed voltage signal 510. This baseline wander distortion may cause signal integrity degradation. For example, the baseline wander distortion may cause voltage level decay with an RL time constant, which may be approximately proportional to L_PoCx/Req (where L_PoCx is an inductance of a power-over-coax injector and its associated passives and Req is an equivalent resistance of a circuit coupling a low-speed transmitter to a coaxial cable). Although, not depicted in the graph 500, this baseline wander distortion can be particularly significant during long strings of the same symbol (e.g., long strings of ones or long strings of zeros) in the first low-speed voltage signal 510.

The graph 500 also shows a plot of a second low-speed voltage signal 520 from a power-over-coax system with baseline wander correction to mitigate baseline wander distortion. For example, the low-speed injection circuitry 240 of FIG. 2 may be utilized to implement baseline wander correction and generate the second low-speed voltage signal 520. The resulting system may have a lower equivalent resistance (Req), which may increase the RL time constant and mitigate the baseline wander distortion in the system. The difference 530 between the second low-speed voltage signal 520 and the first low-speed voltage signal 510 depicted in the graph 500 represents a signal integrity advantage of this later power-over-coax system that generates the second low-speed voltage signal 520.

Figure 6:
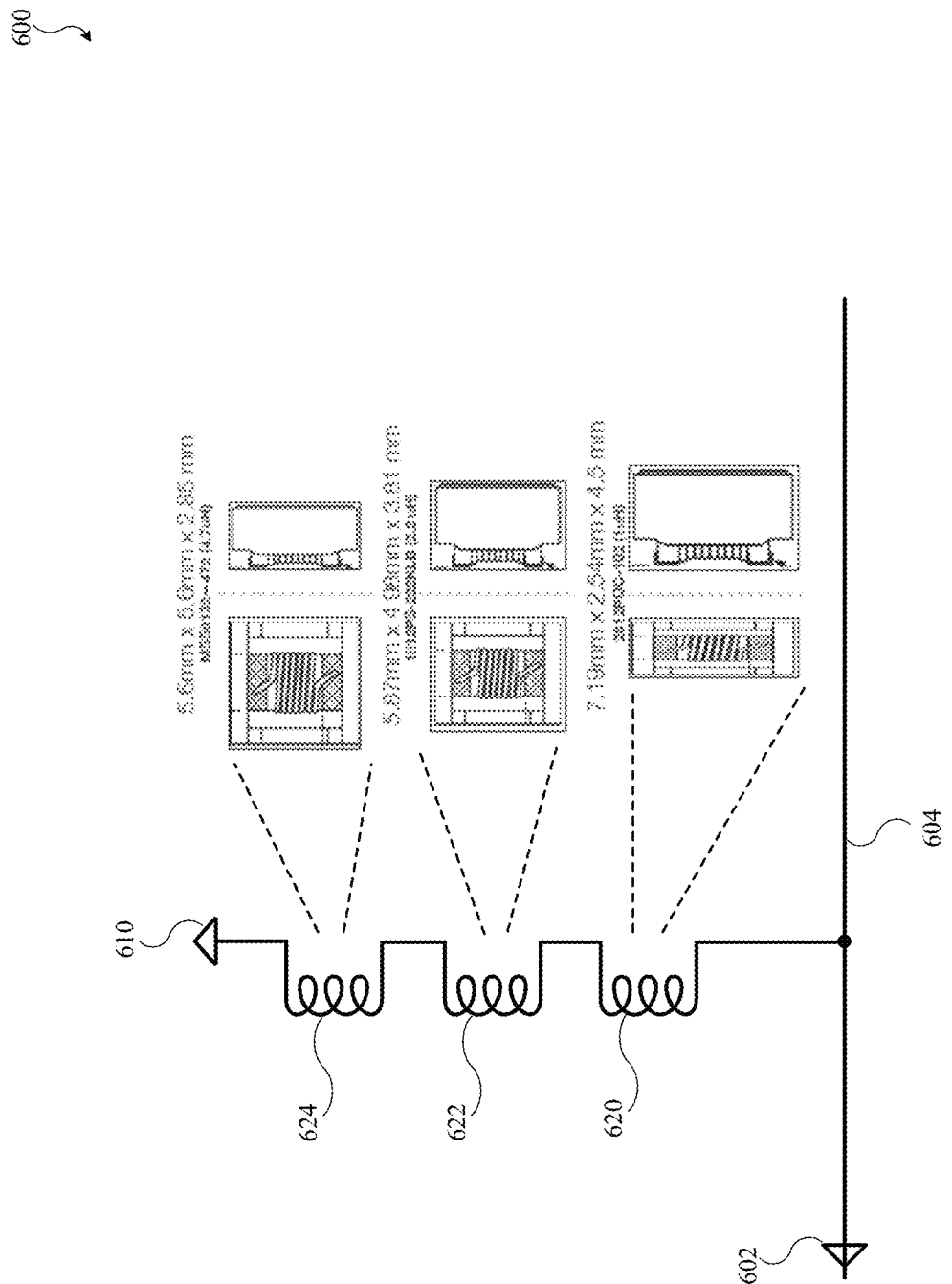
FIG. 6 is a circuit diagram of an example of a system including passives for connecting a power-over-coax power source to a coaxial cable with drawings of example components.

FIG. 6 is a circuit diagram of an example of a system 600 including passives for connecting a power-over-coax power source to a coaxial cable with drawings of example components. The system 600 includes a coaxial cable connector with a first conductor 602 coupled to the first node 604. In this example, the first conductor 602 is connected to the first node 604. For example, when connected to a coaxial cable, the first conductor 602 may be connected to an inner conductor of the coaxial cable. For example, the coaxial cable connector may be an HFM connector, or any coaxial cable connector that is impedance matched to the coaxial cable to be used. The system 600 includes a power-over-coax direct current injector 610 coupled to the first node 604. The power-over-coax direct current injector 610 may supply current (e.g., 2A direct current) that may flow through a coaxial cable connected to the coaxial cable connector to a sensor device (e.g., the sensor device 102) that is powered by this supplied current. The power-over-coax direct current injector 610 is coupled to the first node 604 via three inductors connected in series, including a first inductor 620, a second inductor 622, and a third inductor 624.

For example, the first inductor 620, the second inductor 622, and the third inductor 624 may be configured to support power-over-coax systems delivering 2 Amps of direct current power via a coaxial cable (e.g., 2 A @ 125 C (64 W@35V)). This may help to support higher end sensors (e.g., radar or lidar sensors). The first inductor 620 is a 1 microhenry inductor. The first inductor 620 is in a component package with dimensions 7.19 mm×2.54 mm×4.5 mm. The first inductor 620 may have a larger spacing between windings than conventional 1 microhenry inductors, which may reduce capacitance of the first inductor 620. These properties of the first inductor 620 may be important to maintain high-speed signal integrity. The second inductor 622 is a 2.2 microhenry inductor. The second inductor 622 is in a component package with dimensions 5.87 mm×4.98 mm×3.81 mm. The third inductor 624 is a 4.7 microhenry inductor. The third inductor 624 is in a component package with dimensions 5.6 mm×5.6 mm×2.85 mm. For example, the first inductor 620, the second inductor 622, and the third inductor 624 may be used as the passives 126 of FIG. 1. For example, the first inductor 620, the second inductor 622, and the third inductor 624 may replace the power inductor 212 of FIG. 2. For example, the first inductor 620, the second inductor 622, and the third inductor 624 may be used as the passives 426 of FIG. 4.

As described above, one aspect of the present technology is the gathering and use of data available from various sources to improve a user experience and provide convenience. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to better design future products by arranging components including sensor devices and compute devices to optimize performance in larger system. Thus, the use of some limited personal information may enhance a user experience. Further, other uses for personal information data that benefit the user are also contemplated by the present disclosure.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of vehicle networks, the present technology can be configured to allow users to select to "opt in" or "opt out" of participation in the collection of personal information data during registration for services or anytime thereafter. In another example, users can select not to provide sensor throughput and/or sample loss data. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, sensor data collection statistics can be determined by inferring preferences based on non-personal information data or a bare minimum amount of personal information, such as averages of past data, other non-personal information available to vehicle computing services, or publicly available information.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures.

What is claimed is:

1. A system comprising:
a transmitter with a first differential output terminal and a second differential output terminal, wherein the first differential output terminal is coupled to a first node and the second differential output terminal is coupled to a second node;
a receiver with a single-ended input terminal coupled to a third node; and
an inductor and a resistor connected in series between the first node and the third node in an unbalanced topology with respect to the first differential output terminal and the second differential output terminal.

2. The system of claim 1, wherein the second node is isolated from the third node.

3. The system of claim 1, comprising:
an amplifier coupling the third node to the single-ended input terminal.

4. The system of claim 3, wherein the amplifier comprises:
an operational amplifier.

5. The system of claim 1, comprising:
a coaxial cable connector with a first conductor coupled to the first node.

6. The system of claim 1, comprising:
a power-over-coax direct current extractor coupled to the first node.

7. The system of claim 1, wherein the transmitter is configured to operate at a higher carrier frequency than the receiver.

8. The system of claim 1, wherein the transmitter is configured to transmit CoaXPress high-speed downlink signals and the receiver is configured to receive CoaXPress low-speed uplink signals.

* * * * *